United States Patent
Wu et al.

(10) Patent No.: US 7,760,003 B2
(45) Date of Patent: Jul. 20, 2010

(54) CONTROLLABLE RESISTIVE CIRCUIT FOR PROVIDING A CONTINUOUS VARIABLE RESISTANCE

(75) Inventors: Chia-hsin Wu, Shulin (TW); Shou-tsung Wang, Sinying (TW); Yuan-hung Chung, Jhudong Township (TW)

(73) Assignee: MEDIATEK Inc., Hsin-Chu (TW)

( * ) Notice: Subject to any disclaimer, the term of this patent is extended or adjusted under 35 U.S.C. 154(b) by 0 days.

(21) Appl. No.: 11/550,269

(22) Filed: Oct. 17, 2006

(65) Prior Publication Data
US 2008/0106317 A1    May 8, 2008

(51) Int. Cl.
*H03L 5/00* (2006.01)

(52) U.S. Cl. .................. 327/307; 327/306; 327/308; 327/559

(58) Field of Classification Search ......... 327/306–308, 327/559
See application file for complete search history.

(56) References Cited

U.S. PATENT DOCUMENTS

| | | | |
|---|---|---|---|
| 4,897,559 A * | 1/1990 | Yun-Ho ..................... 327/263 |
| 5,563,545 A | 10/1996 | Scheinberg | |
| 5,687,201 A * | 11/1997 | McClellan et al. .......... 327/157 |
| 6,337,647 B1 * | 1/2002 | Masson et al. .............. 341/150 |
| 6,337,974 B1 * | 1/2002 | Inamori et al. .............. 455/126 |
| 6,441,669 B2 * | 8/2002 | Ooishi ........................ 327/308 |
| 6,442,380 B1 | 8/2002 | Mohindra | |
| 6,469,562 B1 * | 10/2002 | Shih et al. .................... 327/362 |
| 7,154,335 B2 * | 12/2006 | Elmala et al. ............... 330/259 |

* cited by examiner

*Primary Examiner*—Lincoln Donovan
*Assistant Examiner*—John W Poos

(57) ABSTRACT

The present invention sets forth a controllable resistive circuit which comprises a transistor, a capacitor, a charging unit and a discharging unit. The transistor is capable of providing a variable resistance which is controlled to vary continuously and smoothly. The charging and discharging units are used to respectively charge and discharge the capacitor in different periods. As a result, the capacitor can provide a variable voltage which is controlled to vary continuously and smoothly to control the equivalent resistance of the transistor during the period the capacitor is discharging. Therefore, the controllable resistive circuit in accordance with the present invention is capable of being used in any kind of circuit which requires a variable resistance varied continuously and smoothly.

13 Claims, 6 Drawing Sheets

CONTROLLABLE RESISTIVE CIRCUIT FOR PROVIDING A CONTINUOUS VARIABLE RESISTANCE

FIELD OF THE INVENTION

The present invention generally relates to a controllable resistive circuit, and more particularly, to a controllable resistive circuit for providing a variable resistance which is controlled to vary continuously.

BACKGROUND OF THE INVENTION

A conventional resistive circuit can be achieved by connecting several resistors with fixed resistances in parallel. The total equivalent resistance of these resistors can be adjusted by controlling the on/off states of a plurality of switches which are connected between the parallel resistors. Therefore, the equivalent resistance of the resistive circuit can be varied. The resistive circuit is usually used in a switchable RC filter of DC offset cancellation circuit to provide the variable resistance. However, the variable total resistance of the parallel resistors of the resistive circuit is not varied in a continuous form but in a discrete form. The discrete variable resistance of the switchable RC filter will cause a poor frequency response and a longer transient time. Therefore, the switchable RC filter with a discrete variable resistance cannot reliably eliminate DC offsets.

Hence, there is a need to provide a reliably controllable resistive circuit capable of providing a variable resistance which is controlled to vary continuously and smoothly.

SUMMARY OF THE INVENTION

The primary object of the present invention is to provide a controllable resistive circuit for providing a variable resistance which is controlled to vary continuously.

Another object of the present invention is to provide a controllable resistive circuit for DC offset cancellation with continuous and smooth frequency response. The controllable resistive circuit of the present invention is especially applicable for a filtering circuit.

According to the above-mentioned objects, the present invention provides a controllable resistive circuit, which comprises a transistor, a capacitor, a charging unit and a discharging unit. The transistor is capable of providing a variable resistance which is controlled to vary continuously. The charging and discharging units are used to respectively charge and discharge the capacitor in different periods. As a result, the capacitor can provide a variable voltage which is controlled to vary continuously and smoothly to control the equivalent resistance of the transistor during the period the capacitor is discharging. Therefore, the controllable resistive circuit in accordance with the present invention can be used in any kind of circuit which requires a variable resistance which is controlled to vary continuously, e.g. a high pass filter for DC offset cancellation.

The controllable resistive circuit of the present invention is able to provide a variable resistance which is controlled to vary continuously and smoothly. When being used in a filtering circuit, the controllable resistive circuit of the present invention is able to facilitate fast cancellation of DC offsets and provide a smooth frequency response.

DETAILED DESCRIPTION OF THE PREFERRED EMBODIMENTS

Figure 1:
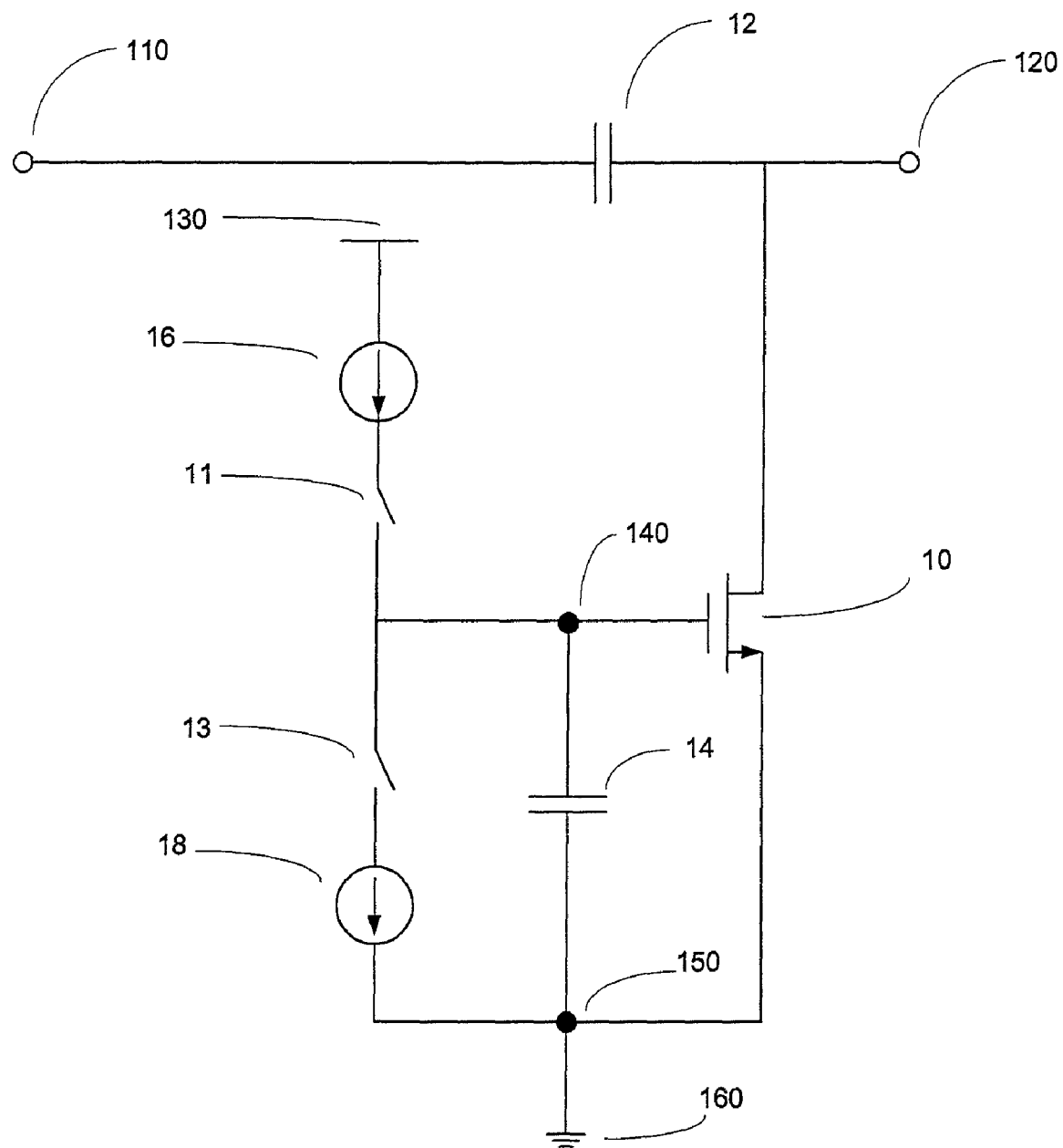
FIG. 1 illustrates a diagram of a controllable resistive circuit in accordance with the present invention.

The present invention is directed to a controllable resistive circuit with variable resistance which is controlled to vary continuously and smoothly. FIG. 1 illustrates a diagram of a controllable resistive circuit in accordance with the present invention. The controllable resistive circuit 1 comprises a transistor 10, a capacitor 14, a charging unit 16, and a discharging unit 18. The transistor 10 is an n-channel metal-oxide semiconductor field-effect transistor (NMOSFET). The transistor 10 is capable of providing a variable resistance between nodes 120 and 150. That is, the variable resistance is provided between the drain and source of transistor 10 and controlled to vary continuously and smoothly. The gate of transistor 10 is connected to a first end of capacitor 14 at node 140. A second end of capacitor 14 is connected to a ground 160 at node 150. The node 150 also can be provided with a bias voltage (not shown) for adjusting the voltage level at the second end of capacitor 14. The node 150 can be treated as a reference node for providing a reference voltage. Although in this embodiment, the transistor 10 is implemented with an NMOSFET transistor, the transistor may also be replaced by another type of transistor, such as a PMOSFET or a bipolar junction transistor (BJT).

The charging and discharging units 16 and 18 are used to respectively charge and discharge the capacitor 14. A switch 11 is connected between the charging unit 16 and node 140, and a switch 13 is connected between the discharging unit 18 and node 140. The capacitor 14 is charged by the charging unit 16 when the switch 11 is closed and the switch 13 is opened. Contrarily, the capacitor 14 is discharged by the discharging unit 18 when the switch 13 is closed and the switch 11 is opened. The charging period and discharging period of the capacitor 14 are not overlapped with each other. However, in another embodiment, the charging unit 16 and discharging unit 18 can be simultaneously switched on or off as long as the rising and falling of voltage at node 140 can be continuously controlled. As a result, the capacitor 14 can provide a variable voltage which is controlled to vary continuously and smoothly to the gate of transistor 10. Therefore, an equivalent resistance between the drain and source of transistor 10 is continuously varied according to the variable voltage applied to the gate of transistor 10. The charging and discharging unit 16 and 18 may be the current sources or other kind of power sources for implementing the charging and discharging operations.

In this embodiment, a first end of capacitor 12 is connected with a node 110, and a second end of capacitor 12 is connected with the drain of transistor 10 at a node 120. The combination of capacitor 12 and transistor 10 is capable of providing a high-pass filter between nodes 110 and 120. The high-pass filter can provide a variable resistance-capacitance (RC) time constant which is controlled to vary continuously and smoothly because the equivalent resistance of transistor 10 is continuously varied. Therefore, the high-pass filter can provide a variable −3 dB bandwidth which is controlled to vary continuously and smoothly.

Figure 2:
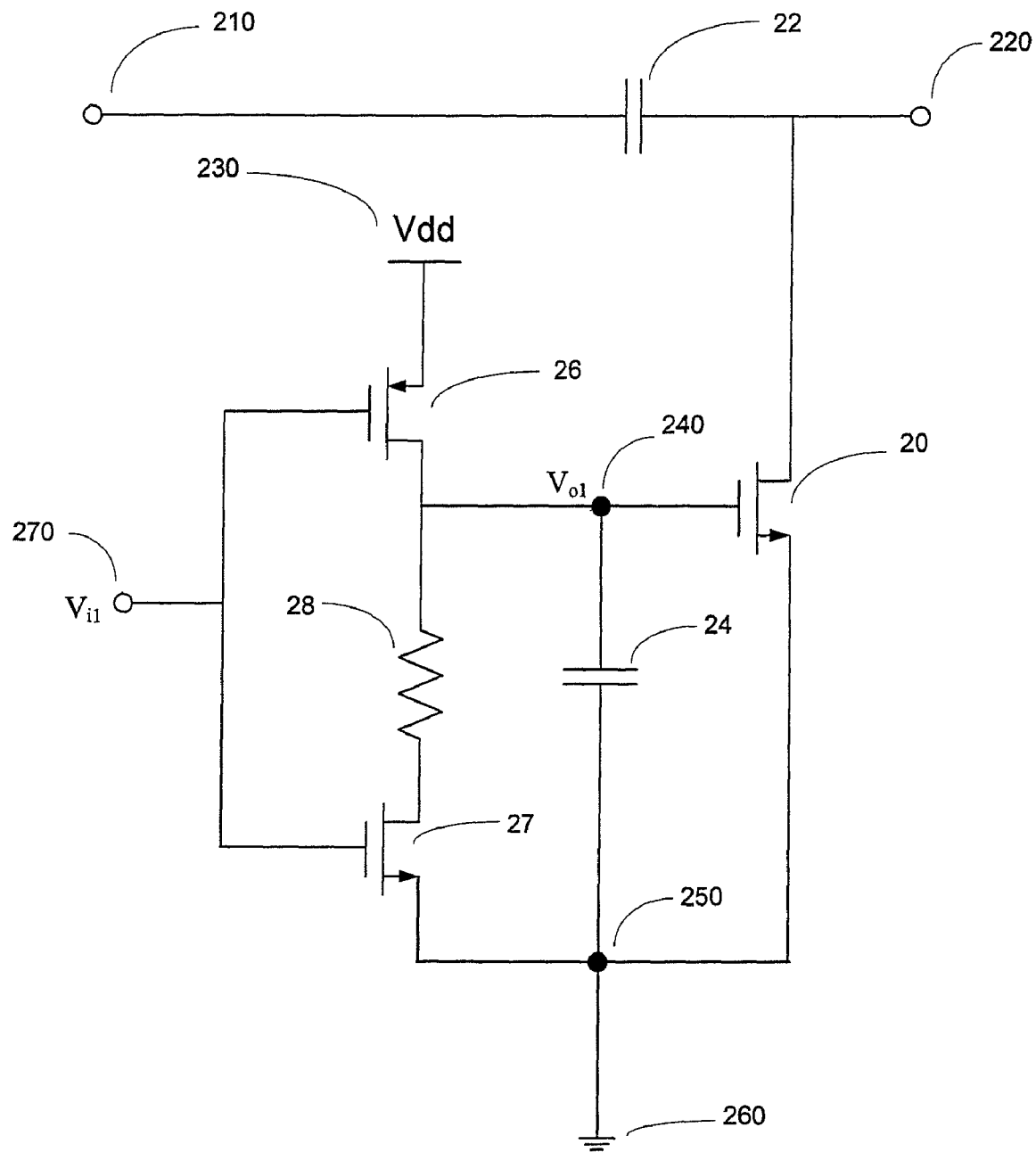
FIG. 2 illustrates a diagram of a second embodiment of the present invention.

FIG. 2 illustrates a diagram of a second embodiment of controllable resistive circuit in accordance with the present invention. The controllable resistive circuit 2 comprises a transistor 20, a capacitor 24, a charging unit 26 and a discharging unit 27. The controllable resistive circuit 2 is similar to the controllable resistive circuit 1 mentioned above. However, the charging unit 26 and discharging unit 27 of the controllable resistive circuit 2 are implemented by transistors.

The charging and discharging units 26 and 27 are used to respectively charge and discharge the capacitor 24. The charging unit 26 is a PMOSFET and the discharging unit 27 is an NMOSFET. The source of the PMOSFET of charging unit 26 is connected to a steady voltage supply Vdd 230, and the drain of the NMOSFET of discharging unit 27 is connected to the ground 260. The charging and discharging units 26 and 27 construct a Complementary MOS (CMOS) inverter between nodes 270 and 240. A voltage $V_{i1}$ is applied from node 270 to the gates of the charging and discharging units 26 and 27. The channel of the charging unit 26 is turned on if the voltage $V_{i1}$ is at a low (logic-0) level, and in the meantime, the channel of the charging unit 28 is turned off. Contrarily, the channel of the discharging unit 27 is turned on if the voltage $V_{i1}$ is at a high (logic-1) level, and meantime the channel of the charging unit 26 is turned off. As a result, the capacitor 24 is charged by the charging unit 26 when the channel of the charging unit 26 is turned on and the channel of the discharging unit 27 is turned off. Contrarily, the capacitor 24 is discharged by the discharging unit 27 when the channel of the discharging unit 27 is turned on and the channel of the charging unit 26 is turned off. The charging period and discharging period of the capacitor 24 are not overlapped with each other. As a result, the capacitor 24 can provide a variable voltage ($V_{o1}$) which is controlled to vary continuously to the gate of transistor 20 at node 240 during the period the capacitor 24 is discharging. Therefore, an equivalent resistance between the drain and source of transistor 20 will be continuously varied according to the variable voltage at the gate of transistor 20.

In the second embodiment of present invention, a first end of a capacitor 22 is connected with a node 210, and a second end of capacitor 22 is connected with the drain of transistor 20 and a node 220. The combination of capacitor 22 and transistor 20 is capable of providing a high-pass filter between nodes 210 and 220. The high-pass filter can provide a variable resistance-capacitance (RC) time constant which is controlled to vary continuously because the equivalent resistance of transistor 20 is continuously varied. Therefore, the high-pass filter can provide a variable −3 dB bandwidth which is controlled to vary continuously and smoothly.

Figure 3:
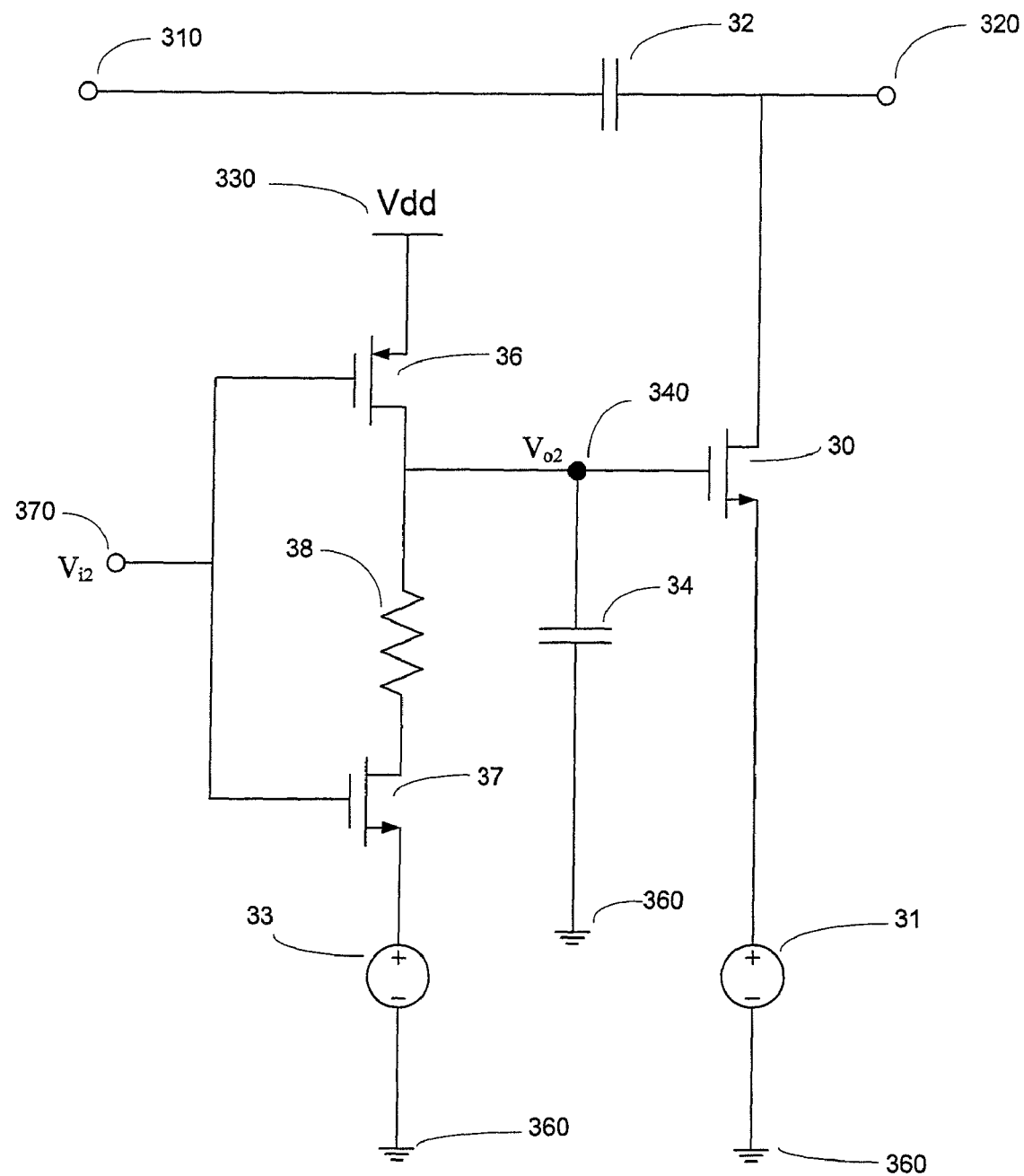
FIG. 3 illustrates a diagram of a third embodiment of the present invention.

FIG. 3 illustrates a diagram of a third embodiment of controllable resistive circuit in accordance with the present invention. A controllable resistive circuit 3 comprises a transistor 30, a capacitor 34, a charging unit 36 and a discharging unit 37. The controllable resistive circuit 3 is similar to the controllable resistive circuit 2 mentioned above. However, the controllable resistive circuit 3 further comprises a power source 31 connected to the source of transistor 30, a power source 33 connected to the source of transistor of discharging unit 37. A voltage $V_{o2}$ is applied to the gate of transistor 30. The voltage $V_{o2}$ can be controlled to vary during the period the capacitor 34 is charging or discharging. The power source 33 provides a steady voltage at the source of transistor of discharging unit 37. The steady voltage of power source 33 is used to determine a lowest voltage of $V_{o2}$ at node 340 for adjusting the resistance of transistor 30. The power source 31 is coupled to the power source 33 for adjusting the voltage difference between the gate and source ($V_{GS}$) of transistor 30.

In the third embodiment of the present invention, a first end of a capacitor 32 is connected with a node 310, and a second end of capacitor 32 is connected with the drain of transistor 30 and a node 320. The combination of capacitor 32 and transistor 30 is capable of providing a high-pass filter between nodes 310 and 320. The high-pass filter can provide a variable resistance-capacitance (RC) time constant which is controlled to vary continuously because the equivalent resistance of transistor 30 is continuously varied. Therefore, the high-pass filter can provide a variable −3 dB bandwidth which is controlled to vary continuously.

Figure 4:
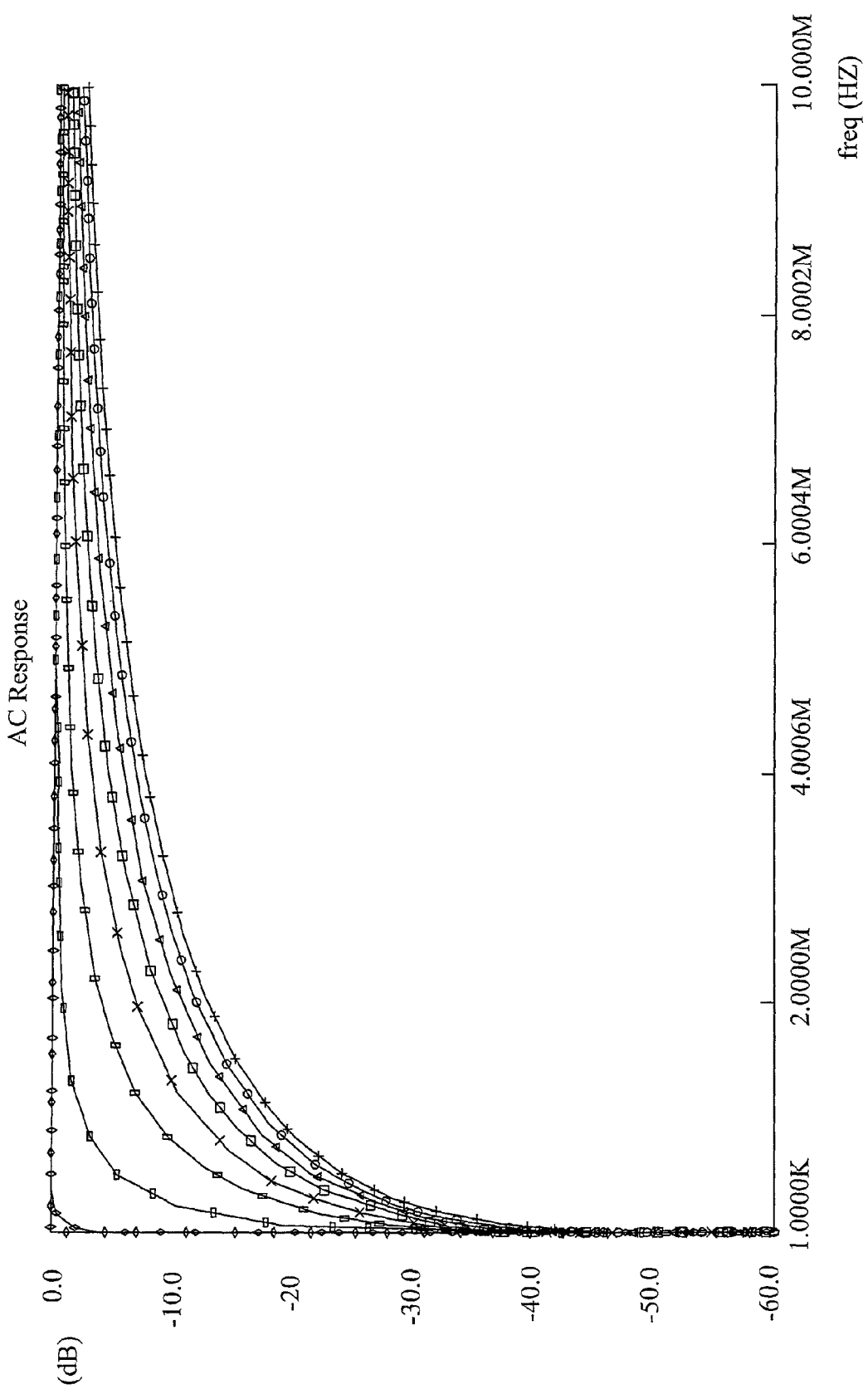
FIG. 4 illustrates the frequency response of a high pass filter which uses the controllable resistive circuit in accordance with the present invention.

FIG. 4 shows the frequency response of a high pass filter which uses the controllable resistive circuit in accordance with the present invention. The equivalent resistance of the controllable resistive circuit is varied based on the variation of a bias voltage applied to the gate of the transistor. The frequency response characteristics of the high pass filter is varied according to the equivalent resistance of the controllable resistive circuit. Accordingly, the high pass filter can settle DC offsets gradually by the continuously varied frequency response characteristics.

Figure 5:
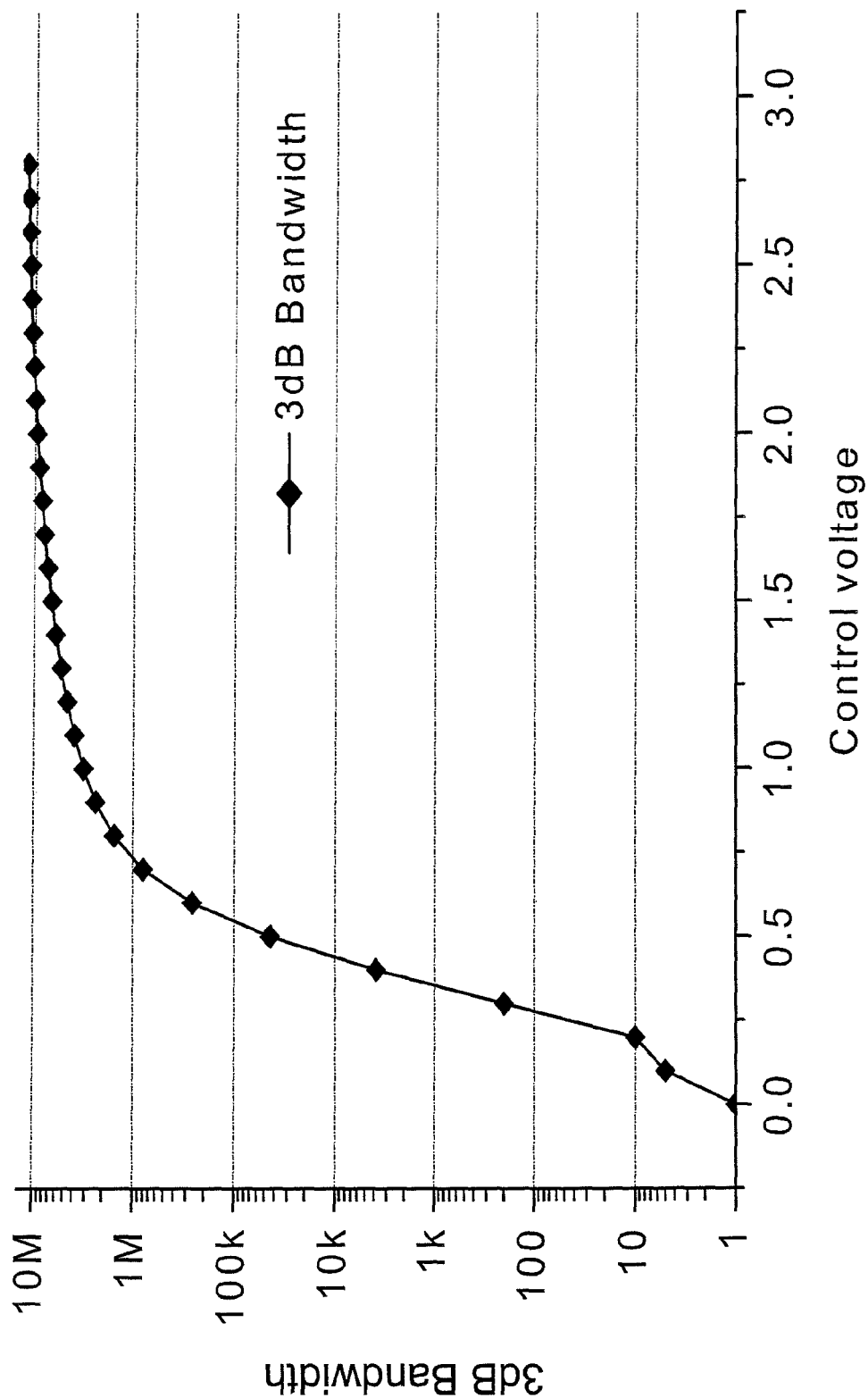
FIG. 5 illustrates a diagram of −3 dB bandwidth frequency variation of a high pass filter which uses the controllable resistive circuit in accordance with the present invention.
Figure 6:
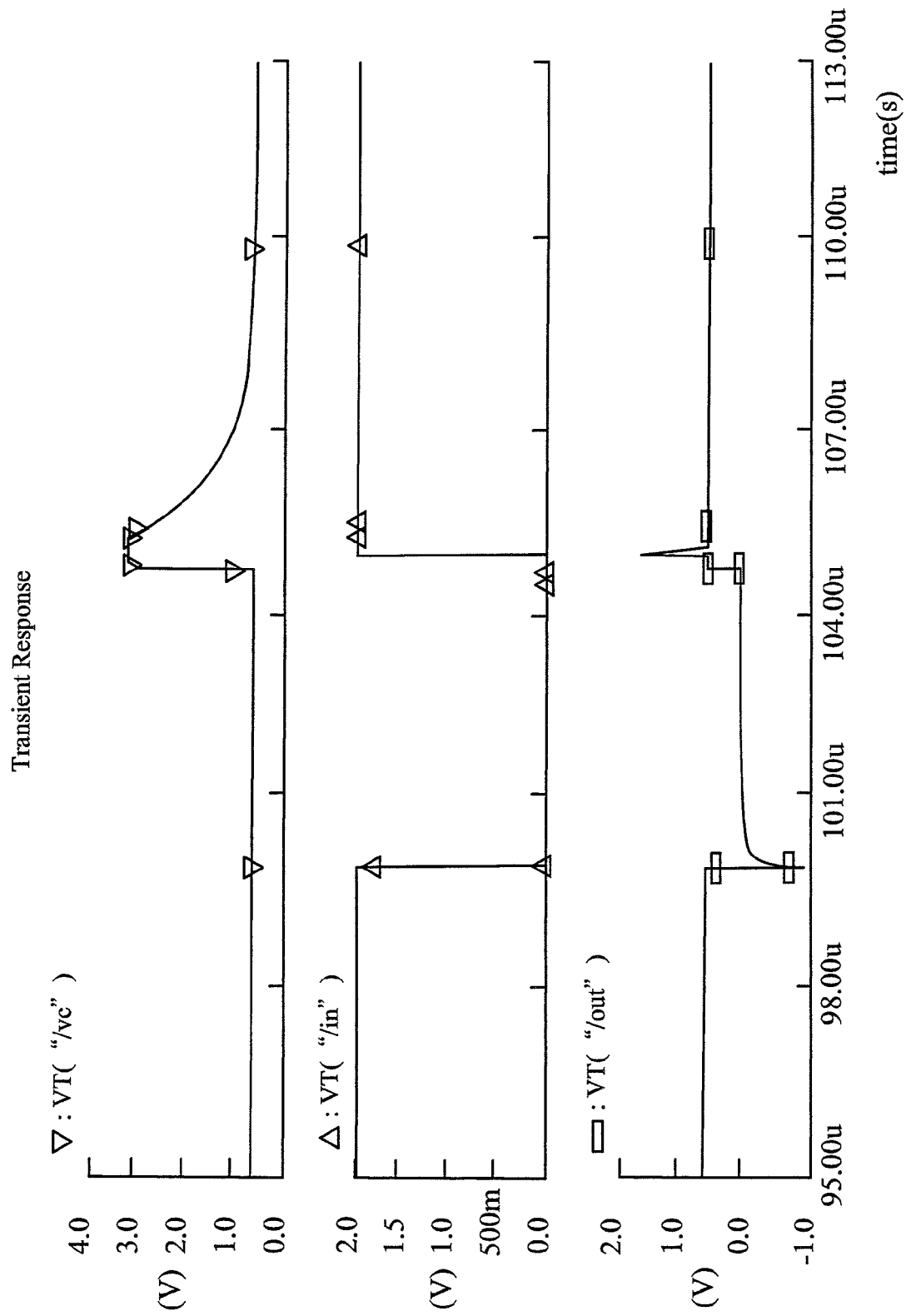
FIG. 6 illustrates a transient response of the high pass filter which uses the controllable resistive circuit in accordance with the present invention.

FIG. 5 shows a diagram of −3 dB bandwidth frequency variation of a high pass filter which uses the controllable resistive circuit in accordance with the present invention. The high pass filter can provide a smooth variable −3 dB bandwidth for the DC offset cancellation because the transistor provides a smooth variable resistance. Further referring to FIG. 6, it shows a transient response of the high pass filter which uses the controllable resistive circuit in accordance with the present invention. The high pass filter is capable of canceling DC offsets in a very short time (approximately 3 μs) because the high pass filter has a frequency response with smoothly variable −3 dB bandwidth.

By utilizing the controllable resistive circuit of the present invention, a variable resistance can be obtained. The variable resistance may be used in a filtering circuit for DC offset cancellation, such as a high pass filter circuit. The filtering circuit which is implemented with the controllable resistive circuit of the present invention can achieve a smooth frequency response of −3 dB bandwidth and a fast cancellation of DC offsets.

Accordingly, the controllable resistive circuit of the present invention is able to provide a variable resistance which is controlled to vary continuously and smoothly. When being used in a filtering circuit, the controllable resistive circuit of the present invention is able to facilitate fast cancellation of DC offsets and provide a smooth frequency response.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A controllable resistive circuit for providing a variable resistance, said controllable resistive circuit comprising:

a first transistor having a first end, a second end and a third end, the first end of first transistor being a gate thereof;

a capacitor having a first terminal coupled to the first end of the first transistor and a second terminal coupled to a reference node;

a charging unit for charging the capacitor in a first period, the charging unit comprising a second transistor having a fourth end, a fifth end connected to a steady voltage supply and a sixth end connected to the first end of the first transistor; and a discharging unit for discharging the capacitor in a second period, the discharging unit comprising a third transistor and a resistor, the third transistor having a seventh end connected to the fourth end of the second transistor, an eighth end connected to a third terminal of the resistor and a ninth end connected to the second terminal of the capacitor, and the resistor further has a fourth terminal connected to the first end of the first transistor, wherein the variable resistance of the controllable resistive circuit is determined based on the equivalent resistance between the second end and the third end of the first transistor, the first period and the second period do not overlap, and the coupling between the first terminal of the capacitor and the first end of the first transistor is not through an operational amplifier.

2. The controllable resistive circuit of claim 1, wherein the second transistor is a p-channel metal-oxide semiconductor field-effect transistor (PMOSFET) and the third transistor is an n-channel metal-oxide semiconductor field-effect transistor (NMOSFET), the fourth end of second transistor is a gate, the fifth end of second transistor is a source, the sixth end of second transistor is a drain, and the seventh end of third transistor is a gate, the eighth end of third transistor is a drain, the ninth end of third transistor is a source.

3. A resistive circuit for providing a variable resistance, said resistive circuit comprising:

a first transistor having a first end, a second end and a third end;

a capacitor having a first terminal connected to the first end of the first transistor and a second terminal connected to a ground;

a resistor having a third terminal connected to the first end of the first transistor and a fourth terminal;

a second transistor having a fourth end, a fifth end connected to a steady voltage supply node and a sixth end connected to the first end of the first transistor;

a third transistor having a seventh end connected to the fourth end of the second transistor, an eighth end connected to the fourth terminal of the resistor and a ninth end;

a first voltage source having a fifth terminal connected to the third end of the first transistor and a sixth terminal connected to the ground; and a second voltage source having a seventh terminal connected to the ninth end of the third transistor and an eighth terminal connected to the ground;

wherein the determination of the variable resistance is based on the equivalent resistance between the second end and the third end of the first transistor.

4. The resistive circuit of claim 3, wherein the first transistor is a metal-oxide semiconductor field-effect transistor, and the first end of first transistor is a gate, the second end of first transistor is a drain, and the third end of first transistor is a source.

5. The resistive circuit of claim 3, wherein the second transistor is a p-channel metal-oxide semiconductor field-effect transistor (PMOSFET) and the third transistor is an n-channel metal-oxide semiconductor field-effect transistor (NMOSFET), the fourth end of second transistor is a gate, the fifth end of second transistor is a source, the sixth end of second transistor is a drain, and the seventh end of third transistor is a gate, the eighth end of third transistor is a drain, the ninth end of third transistor is a source.

6. A filtering circuit for providing a variable resistance-capacitance time constant, said filtering circuit comprising:

a first capacitor having a first terminal for receiving an input signal and a second terminal for outputting an output signal;

a first transistor having a first end, a second end connected to the second terminal of the first capacitor, and a third end connected to a ground, the first end of first transistor being a gate thereof;

a second capacitor having a third terminal connected to the first end of the first transistor and a fourth terminal connected to the ground, the coupling between the third terminal of the second capacitor and the first end of the first transistor being not through an operational amplifier;

a charging unit for charging the second capacitor in a first period; and a discharging unit for discharging the second capacitor in a second period;

wherein the variable resistance-capacitance time constant of the filtering circuit is determined based on the equivalent resistance between the second end and the third end of the first transistor, the first period and the second period do not overlap.

7. The filtering circuit of claim 6, wherein the first transistor is a metal-oxide semiconductor field-effect transistor, the second end of first transistor is a drain, and the third end of first transistor is a source.

8. The filtering circuit of claim 6, wherein the charging unit comprises a second transistor having a fourth end, a fifth end connected to a steady voltage supply and a sixth end connected to the first end of the first transistor, and the discharging unit comprises a third transistor and a resistor, the third transistor having a seventh end connected to the fourth end of the second transistor, an eighth end connected to a fifth terminal of the resistor and a ninth end connected to the fourth terminal of the second capacitor, and the resistor further has a sixth terminal connected to the first end of the first transistor.

9. The filtering circuit of claim 8, wherein the second transistor is a p-channel metal-oxide semiconductor field-effect transistor (PMOSFET) and the third transistor is an n-channel metal-oxide semiconductor field-effect transistor (NMOSFET), the fourth end of second transistor is a gate, the fifth end of second transistor is a source, the sixth end of second transistor is a drain, and the seventh end of third transistor is a gate, the eighth end of third transistor is a drain, the ninth end of third transistor is a source.

10. A filtering circuit for providing a variable resistance-capacitance time constant, said filtering circuit comprising:

a first capacitor having a first terminal for receiving an input signal and a second terminal for outputting an output signal;

a first transistor having a first end, a second end connected to the second terminal of the first capacitor, and a third end, the first end of first transistor being a gate thereof;

a second capacitor having a third terminal connected to the first end of the first transistor and a fourth terminal connected to the ground, the coupling between the third terminal of the second capacitor and the first end of the first transistor being not through an operational amplifier;

a charging unit for charging the second capacitor in a first period; and a discharging unit for discharging the second capacitor in a second period;

wherein the variable resistance-capacitance time constant of the filtering circuit is determined based on the equivalent resistance between the second end and the third end of the first transistor, the first period and the second period do not overlap.

11. The filtering circuit of claim 10, wherein the first transistor is a metal-oxide semiconductor field-effect transistor, the second end of first transistor is a drain, and the third end of first transistor is a source.

12. The filtering circuit of claim 10, wherein the charging unit comprises a second transistor having a fourth end, a fifth end connected to a steady voltage supply and a sixth end connected to the first end of the first transistor, and the discharging unit comprises a third transistor and a resistor, the third transistor having a seventh end connected to the fourth end of the second transistor, an eighth end connected to a fifth terminal of the resistor and a ninth end connected to the fourth terminal of the second capacitor, and the resistor further has a sixth terminal connected to the first end of the first transistor.

13. The filtering circuit of claim 12, wherein the second transistor is a p-channel metal-oxide semiconductor field-effect transistor (PMOSFET) and the third transistor is an n-channel metal-oxide semiconductor field-effect transistor (NMOSFET), the fourth end of second transistor is a gate, the fifth end of second transistor is a source, the sixth end of second transistor is a drain, and the seventh end of third transistor is a gate, the eighth end of third transistor is a drain, the ninth end of third transistor is a source.

* * * * *